(12) United States Patent
Kim et al.

(10) Patent No.: US 10,182,429 B2
(45) Date of Patent: Jan. 15, 2019

(54) METHOD AND DEVICE FOR TRANSMITTING OR RECEIVING SIGNAL IN WIRELESS COMMUNICATION SYSTEM

(71) Applicant: Samsung Electronics Co., Ltd, Gyeonggi-do (KR)

(72) Inventors: Kwang-Taik Kim, Gyeonggi-do (KR); Seok-Ki Ahn, Gyeonggi-do (KR); Jeong-Ho Park, Seoul (KR); Chi-Woo Lim, Gyeonggi-do (KR); Jae-Weon Cho, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/325,420

(22) PCT Filed: Mar. 17, 2016

(86) PCT No.: PCT/KR2016/002681
§ 371 (c)(1),
(2) Date: Jan. 10, 2017

(87) PCT Pub. No.: WO2016/148520
PCT Pub. Date: Sep. 22, 2016

(65) Prior Publication Data
US 2018/0227884 A1   Aug. 9, 2018

(30) Foreign Application Priority Data
Mar. 17, 2015  (KR) .................... 10-2015-0036653

(51) Int. Cl.
*H04W 72/04*   (2009.01)
*H04L 1/00*   (2006.01)
(Continued)

(52) U.S. Cl.
CPC .............. *H04W 72/042* (2013.01); *H04L 1/00* (2013.01); *H04L 1/0025* (2013.01); *H04L 1/18* (2013.01);
(Continued)

(58) Field of Classification Search
CPC ........... H04L 1/00; H04L 1/18; H04L 1/0025; H04W 72/1289; H04W 72/042; H04W 72/121
See application file for complete search history.

(56) References Cited

U.S. PATENT DOCUMENTS

| | | | |
|---|---|---|---|
| 2004/0086027 A1* | 5/2004 | Shattil | H04L 25/03834 375/146 |
| 2008/0031177 A1 | 2/2008 | Lee et al. | |

(Continued)

FOREIGN PATENT DOCUMENTS

KR   1020080012124   2/2008

OTHER PUBLICATIONS

International Search Report dated Jul. 21, 2016 in connection with International Application No. PCT/KR2016/002681, 5 pages.
(Continued)

*Primary Examiner* — Oussama Roudani

(57) ABSTRACT

Disclosed is a method and apparatus for transmitting information in a communication system. The present invention relates to a millimeter wave beamforming-based 5G or pre-5G wireless communication system for supporting a higher data rate beyond a 4G network or LTE system. A method according to the present invention comprises the steps of: determining the number of blocks and a window size for configuring a transmission period for sliding window superposition coding (SWSC); transmitting control information including the determined number of blocks and window size to a plurality of terminals participating in the
(Continued)

SWSC; transmitting, in a first block within the transmission period, a signal in which a first message and a second message are superposition-coded by first and second codes; and when a message notifying that the first message is not successfully decoded is received, transmitting, in a second block, a signal in which the second message and the first message are superposition-coded by the first and second codes.

24 Claims, 14 Drawing Sheets

(51) Int. Cl.
    *H04L 1/18* (2006.01)
    *H04W 72/12* (2009.01)
(52) U.S. Cl.
    CPC ..... *H04W 72/121* (2013.01); *H04W 72/1289* (2013.01)

(56) References Cited

U.S. PATENT DOCUMENTS

| | | | | |
|---|---|---|---|---|
| 2010/0316024 | A1* | 12/2010 | Kiran | H04L 1/0006 370/335 |
| 2011/0249569 | A1* | 10/2011 | Mashino | H04J 11/0023 370/242 |
| 2013/0156139 | A1 | 6/2013 | Lee et al. | |
| 2014/0071894 | A1* | 3/2014 | Kairouz | H04W 88/06 370/328 |
| 2017/0294981 | A1* | 10/2017 | Kim | H04L 1/06 |

OTHER PUBLICATIONS

Lele Wang, et al., "Sliding-Window Superposition Coding for Interference Networks", IEEE International Symposium on Information Theory, 2014, 5 pages.

* cited by examiner

| | block j | 1 | 2 | 3 | ... | b-1 | b |
|---|---|---|---|---|---|---|---|
| 205 | U | 1 | $m_{11}$ | $m_{12}$ | ... | ... | $m_{1,b-1}$ |
| 210 — S1 | V | $m_{11}$ | $m_{12}$ | ... | ... | $m_{1,b-1}$ | 1 |
| | $X_1 = f(U,V)$ | | | | ... | | |
| 215 — S2 | $X_2$ | $m_{21}$ | $m_{22}$ | ... | ... | $m_{2,b-1}$ | $m_{2b}$ |
| 220 — R1 | $Y_1$ | $\phi$ | $\hat{m}_{11}$ | $\hat{m}_{12}$ | ... | ... | $\hat{m}_{1,b-1}$ |
| | | $\hat{m}_{21}$ | $\hat{m}_{22}$ | ... | ... | $\hat{m}_{2,b-1}$ | $\hat{m}_{2b}$ |
| 225 — R2 | $Y_2$ | $\phi$ | $\hat{m}_{11}$ | $\hat{m}_{12}$ | ... | ... | $\hat{m}_{1,b-1}$ |
| | | $\phi$ | $\hat{m}_{21}$ | $\hat{m}_{22}$ | ... | ... | $\hat{m}_{2,b-1},\hat{m}_{2b}$ |

FIG.2

|   | block j | 1 | 2 | 3 | 4 | ... | b-1 | b |
|---|---------|---|---|---|---|-----|-----|---|
| S1 | U | 1 | $m_{11}$ | $m_{12}$ | $m_{11}$ | ... | ... | $m_{1,b-1}$ |
| S1 | V | $m_{11}$ | $m_{12}$ | $m_{11}$ | $m_{13}$ | ... | $m_{1,b-1}$ | 1 |
|   | $X_1 = f(U,V)$ |   |   |   |   | ... | ... |   |
| S2 | $X_2$ | $m_{21}$ | $m_{22}$ | $m_{23}$ | $m_{24}$ | ... | $m_{2,b-1}$ | $m_{2b}$ |
| R1 | $Y_1$ | $\Phi$ | $\hat{m}_{11}$ | $\hat{m}_{12}$ | ... | ... | ... | $m_{1,b-1}$ |
| R1 |   | $\hat{m}_{21}$ | $\hat{m}_{22}$ | ... | ... | ... | $\hat{m}_{2,b-1}$ | $\hat{m}_{2b}$ |
| R2 | $Y_2$ | $\Phi$ | $\hat{m}_{11}$ | $\hat{m}_{12}$ | ... | ... | ... | $\hat{m}_{1,b-1}$ |
| R2 |   | $\Phi$ | $\hat{m}_{21}$ | $\hat{m}_{22}$ | ... | ... | ... | $\hat{m}_{2,b-1}, \hat{m}_{2b}$ |

Blocks decoded thus far → 700 | Retransmission blocks 705 → 710

FIG.7

| block j | 1 | 2 | 3 | 4 | ... | b-1 | b |
|---|---|---|---|---|---|---|---|
| U | 1 | $m_{11}$ | $m_{12}$ | 1 | ... | ... | $m_{1,b-1}$ |
| V | $m_{11}$ | $m_{12}$ | $m_{11}$ | $m_{13}$ | ... | $m_{1,b-1}$ | 1 |
| $X_1 = f(U,V)$ | | | | ... | ... | | |
| $X_2$ | $m_{21}$ | $m_{22}$ | $m_{23}$ | $m_{24}$ | ... | $m_{2,b-1}$ | $m_{2b}$ |
| $Y_1$ | $\phi$ | $\hat{m}_{11}$ | $\hat{m}_{12}$ | ... | ... | ... | $m_{1,b-1}$ |
| | $\hat{m}_{21}$ | $\hat{m}_{22}$ | ... | ... | ... | $\hat{m}_{2,b-1}$ | $\hat{m}_{2b}$ |
| $Y_2$ | $\phi$ | $\hat{m}_{11}$ | $\hat{m}_{12}$ | ... | ... | ... | $\hat{m}_{1,b-1}$ |
| | $\phi$ | $\hat{m}_{21}$ | $\hat{m}_{22}$ | ... | ... | ... | $\hat{m}_{2,b-1},\hat{m}_{2b}$ |

Blocks decoded thus far ← | → Retransmission blocks 1000 / 1005 / 1010

Rows grouped as S1, S2, R1, R2.

FIG.10

METHOD AND DEVICE FOR TRANSMITTING OR RECEIVING SIGNAL IN WIRELESS COMMUNICATION SYSTEM

CROSS-REFERENCE TO RELATED APPLICATIONS AND CLAIM OF PRIORITY

The present application claims priority under 35 U.S.C. § 365 to International Patent Application No. PCT/KR2016/002681 filed Mar. 17, 2016, entitled "METHOD AND DEVICE FOR TRANSMITTING OR RECEIVING SIGNAL IN WIRELESS COMMUNICATION SYSTEM", and, through International Patent Application No. PCT/KR2016/002681, to Korean Patent Application No. 10-2015-0036653 filed Mar. 17, 2015, each of which are incorporated herein by reference into the present disclosure as if fully set forth herein.

TECHNICAL FIELD

The present invention relates to methods and apparatuses of transmitting and receiving signals in wireless communication systems.

BACKGROUND ART

In order to meet increasing wireless data traffic demand in wireless communication systems, efforts have been made to develop beyond 4G network, post-LTE, enhanced fifth-generation (5g), and pre-5G systems.

These enhanced systems are being taken into account on ultra-high frequency (mmWave) bands, in particular, a 60 GHz band, and such techniques are under discussion as beamforming, massive array multiple input multiple output (MIMO), full-dimensional multiple input multiple output (FD-MIMO), array antennas, analog beamforming, and large-scale antennas.

Also being developed are various technologies to have an enhanced network, such as evolved or advanced small cell, cloud radio access network (cloud RAN), ultra-dense network, device-to-device (D2D) communication, wireless backhaul, moving network, cooperative communication, coordinated multi-point (CoMP), and interference cancellation.

There are also other various schemes under development for the 5G system including, e.g., hybrid FSK and QAM modulation (FQAM) and sliding window superposition coding (SWSC), which are advanced coding modulation (ACM) schemes, and filter bank multi-carrier (FBMC), non-orthogonal multiple access (NOMA) and sparse code multiple access (SCMA), which are advanced access schemes.

Wireless communication systems are being developed in various types to deliver voice and/or data. A typical wireless communication system or network provides various multiplexing techniques, including frequency division multiplexing (FDM), time division multiplexing (TDM), code division multiplexing (CDM), and orthogonal frequency division multiplexing (OFDM), to allow multiple users to access one shared resource.

Cellular wireless communication systems provide multiple base stations (BSs), access points (APs), Node Bs (NBs), and enhanced Node Bs (eNBs) for a coverage area. The base stations have their respective unique coverage areas (i.e., cells or sectors) that may overlap each other that terminals (mobile stations (MSs), user equipment (UE), wireless terminals, or mobile devices) may independently receive. Likewise, a terminal may transmit data to the base station operating the coverage area of the terminal or to another terminal in a similar manner. In next-generation communication systems, the cell size gradually reduces due to inter-cell interference, and interference signals from neighbor cells become a major cause for a degradation in the efficiency of detecting desired signals.

A representative technique for interference mitigation is interference-aware successive decoding (IASD). The IASD has been developed to address problems at the cell edge in cellular system, adopting the concept of interference-aware receiver capable of successfully decoding both desired signals and interference signals. Since interference signals are out of the control by the terminal, the IASD requires support by the network. In order to avail cellular system of the IASD, network assisted interference cancellation and suppression (NAICS) is being discussed. NAICS allows an interference signal and desired signal to be transmitted through the same resource and provides signaling and channel estimation information from the network to decode and detect interference signals.

The IASD may advantageously be implemented at a relatively low complexity because of avoiding simultaneous decoding involving a high complexity, but for the same reason, its performance may be greatly far away from the Shannon limit that is theoretically known to be the maximum information transmission speed. This leads to the need for technology for addressing a deterioration of receive performance in terminals at cell edges due to interference by neighbor cells and achieving the maximum theoretical performance of the physical layer in such interference circumstances.

DETAILED DESCRIPTION OF THE INVENTION

Technical Problem

According to the present invention, there are provided a method and apparatus for communicating a signal in a communication system.

According to the present invention, there are provided a method and apparatus for enhancing the throughput of terminals located at a cell edge in a cellular environment.

According to the present invention, there are provided a method and apparatus for preventing a deterioration of receive performance due to interference by a neighbor cell in a cellular wireless communication system According to the present invention, there are provided a method and apparatus for using a sliding-window superposition coding (SWSC) scheme in a cellular environment.

According to the present invention, there is provided a coding scheme for achieving the maximum theoretical performance at relatively a low complexity on an interference channel.

According to the present invention, there are provided a method and apparatus for supporting the hybrid automatic repeat request (HARD) in SWSC transmission.

Technical Solution

According to a preferred embodiment of the present invention, a method for transmitting a signal in a wireless communication system comprises the steps of determining a window size and the number of blocks constituting a transmission period for a sliding window superposition coding (SWSC), transmitting control information including the determined window size and number of the blocks to a plurality of terminals participating in the SWSC, transmitting a signal obtained by superposition-coding a first message and a second message using a first code and a second code at a first block in the transmission period, and upon receiving a message indicating that decoding the first message fails, transmitting the signal obtained by superposition-coding the first message and the second message using the first code and the second code at a second block.

According to an embodiment of the present invention, a method for receiving a signal in a wireless communication system comprises the steps of receiving, from a base station, control information including a window size and the number of blocks constituting a transmission period for a sliding window superposition coding (SWSC), receiving a signal obtained by superposition-coding a first message and a second message using a first code and a second code at a first block in the transmission period, transmitting a message indicating that decoding the first message fails, and receiving the signal obtained by superposition-coding the first message and the second message using the first code and the second code at a second block.

According to an embodiment of the present invention, an apparatus for transmitting a signal in a wireless communication system comprises a processor determining a window size and the number of blocks constituting a transmission period for a sliding window superposition coding (SWSC) and a transceiver transmitting control information including the determined window size and number of the blocks to a plurality of terminals participating in the SWSC, transmitting a signal obtained by superposition-coding a first message and a second message using a first code and a second code at a first block in the transmission period, and upon receiving a message indicating that decoding the first message fails, transmitting the signal obtained by superposition-coding the first message and the second message using the first code and the second code at a second block.

According to an embodiment of the present invention, an apparatus for receiving a signal in a wireless communication system comprises a transceiver receiving, from a base station, control information including a window size and the number of blocks constituting a transmission period for a sliding window superposition coding (SWSC), receiving a signal obtained by superposition-coding a first message and a second message using a first code and a second code at a first block in the transmission period, transmitting a message indicating that decoding the first message fails, and receiving the signal obtained by superposition-coding the first message and the second message using the first code and the second code at a second block and a processor controlling the transceiver according to the control information.

BRIEF DESCRIPTION OF DRAWINGS

Particular preferred embodiments of the present invention and the foregoing and other aspects, features, and advantages will be apparent from the following detailed description taken in conjunction with the accompanying drawings, wherein:

FIG. 2 is a transmission and reception diagram for describing an SWSC operation according to an embodiment of the present invention;

FIG. 7 is a transmission and reception diagram according to the flow of FIG. 6;

FIG. 10 is a transmission and reception diagram according to the flow of FIG. 9;

It should be noted that the same or similar reference denotations may be used to refer to the same or similar elements, features, or structures throughout the drawings.

MODE FOR CARRYING OUT THE INVENTION

Figure 1A:
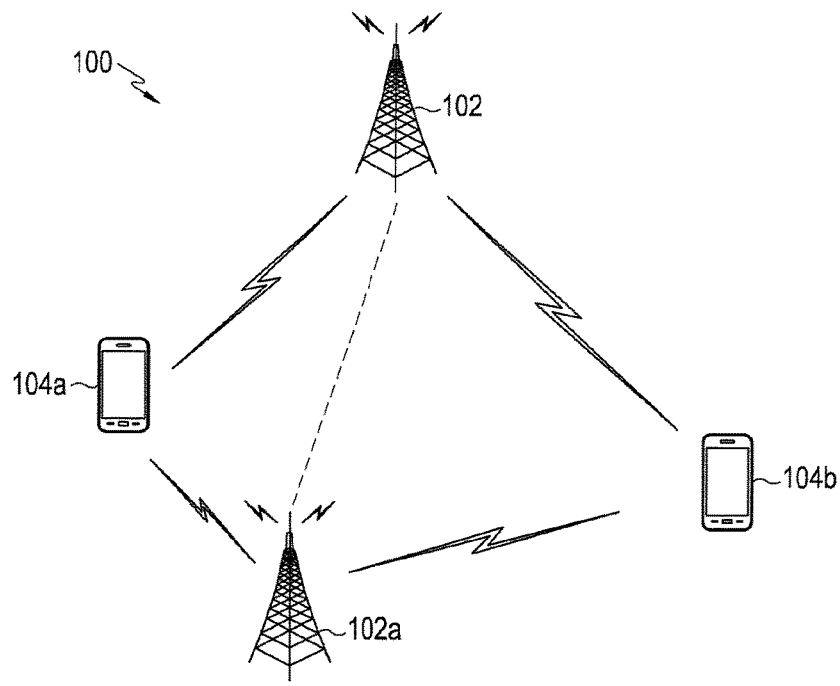
FIG. 1a illustrates a cellular-based wireless communication system according to an embodiment of the present invention.

Hereinafter, embodiments of the present invention are described in detail with reference to the accompanying drawings.

In describing the embodiments, the description of technologies that are known in the art and are not directly related to the present invention is omitted. This is for further clarifying the gist of the present invention without making it unclear.

For the same reasons, some elements may be exaggerated or schematically shown. The size of each element does not necessarily reflects the real size of the element. The same reference numeral is used to refer to the same element throughout the drawings.

Advantages and features of the present invention, and methods for achieving the same may be understood through the embodiments to be described below taken in conjunction with the accompanying drawings. However, the present invention is not limited to the embodiments disclosed herein, and various changes may be made thereto. The embodiments disclosed herein are provided only to inform one of ordinary skilled in the art of the category of the present invention. The present invention is defined only by the appended claims. The same reference numeral denotes the same element throughout the specification.

It should be appreciated that the blocks in each flowchart and combinations of the flowcharts may be performed by computer program instructions. Since the computer program instructions may be equipped in a processor of a general-use computer, a special-use computer or other programmable data processing devices, the instructions executed through a processor of a computer or other programmable data processing devices generate means for performing the functions described in connection with a block(s) of each flowchart. Since the computer program instructions may be stored in a computer-available or computer-readable memory that may be oriented to a computer or other programmable data processing devices to implement a function in a specified manner, the instructions stored in the computer-available or computer-readable memory may produce a product including an instruction means for performing the functions described in connection with a block(s) in each flowchart. Since the computer program instructions may be equipped in a computer or other programmable data processing devices, instructions that generate a process executed by a computer as a series of operational steps are performed over the computer or other programmable data processing devices and operate the computer or other programmable data processing devices may provide steps for executing the functions described in connection with a block(s) in each flowchart.

Further, each block may represent a module, segment, or part of a code including one or more executable instructions for executing a specified logical function(s). Further, it should also be noted that in some replacement execution examples, the functions mentioned in the blocks may occur in different orders. For example, two blocks that are consecutively shown may be performed substantially simultaneously or in a reverse order depending on corresponding functions.

As used herein, the term "unit" means a software element or a hardware element such as a field-programmable gate array (FPGA) or an application specific integrated circuit (ASIC). A unit plays a certain role. However, the term "unit" is not limited as meaning a software or hardware element. A 'unit' may be configured in a storage medium that may be addressed or may be configured to reproduce one or more processors. Accordingly, as an example, a 'unit' includes elements, such as software elements, object-oriented software elements, class elements, and task elements, processes, functions, attributes, procedures, subroutines, segments of program codes, drivers, firmware, microcodes, circuits, data, databases, data architectures, tables, arrays, and variables. A function provided in an element or a 'unit' may be combined with additional elements or may be split into sub elements or sub units. Further, an element or a 'unit' may be implemented to reproduce one or more CPUs in a device or a security multimedia card.

Although the description of embodiments herein primarily focuses on cellular-based wireless communication systems, particularly, 3GPP EUTRA standards, the subject matter of the present invention may also be applicable to other communication systems and services having similar technical backgrounds and channel types without departing from the scope of the present invention, and this may be determined by one of ordinary skill in the art.

FIG. 1a illustrates a cellular-based wireless communication system according to an embodiment of the present invention.

Referring to FIG. 1, a system 100 includes one or more base stations 102 or 102a that may transmit/receive and exchange wireless signals with one or more terminals 104a or 104b located in a cell or sector. Each base station 102 or 102a may include a transmit chain and a receive chain each of which may include a plurality of components related to signal transmission and reception, i.e., a processor, a modulator, a multiplexer, a demodulator, a demultiplexer, and antennas. The terminal 104a or 104b may be, e.g., a cellular phone, a smartphone, a laptop computer, a portable communication device, a portable computing device, a satellite radio, a GPS, a personal digital device (PDA), and/or other wireless communication devices.

The base station 102 may simultaneously communicate with two terminals 104a and 104b through one or more subcarriers or carrier components. The base station 102 is configured to support various types of users, such as the terminals 104a and 104b located at a cell edge or nearby terminals (not shown). The terminal located adjacent to the base station 102 may be subject to little or no influence by inter-cell interference, but the terminals 104a and 104b located at the cell edge may receive signals transmitted from the neighbor cell base station 102a as interference. Likewise, a signal transmitted from the base station 120 to the terminal 104a (i.e., a signal desired by the terminal 104a) may act as interference with the terminal 104b, and a signal from the base station 120 to the terminal 104b (i.e., a signal desired by the terminal 104b) may interfere with the terminal 104a.

Figure 1B:
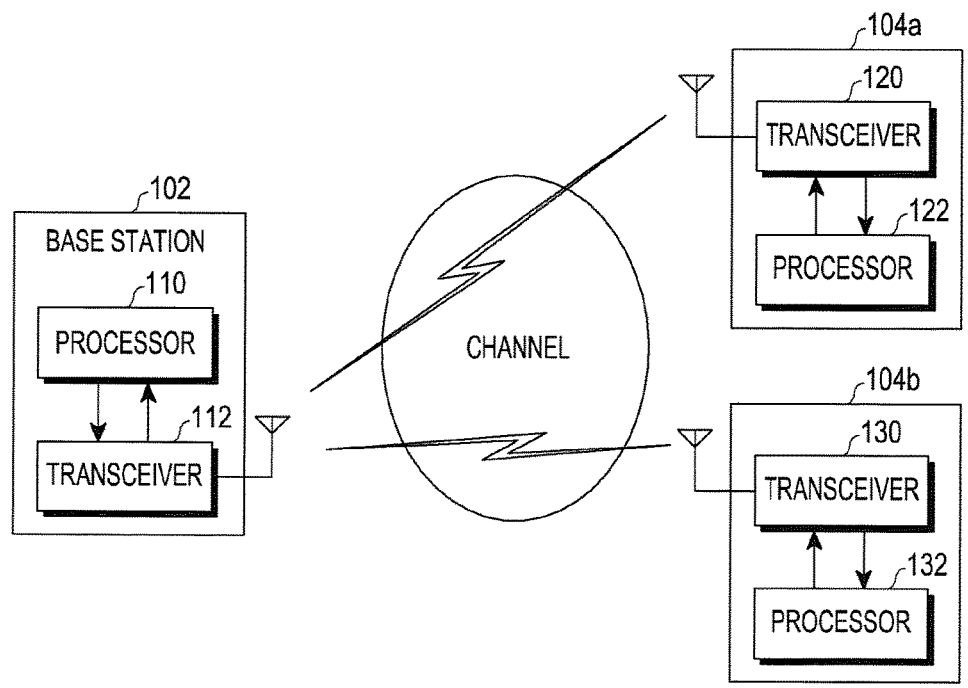
FIG. 1b is a block diagram illustrating the structure of a base station and a terminal according to an embodiment of the present invention.

FIG. 1b is a block diagram illustrating the structure of a base station and a terminal according to an embodiment of the present invention.

Referring to FIG. 1b, the base station 102 includes a transceiver 112 capable of communicating wireless signals through antennas with one or more terminals, e.g., the terminals 104a and 104b and a processor 110 controlling the communication by the transceiver 112, and as necessary, communicating via a backhaul with another base station, e.g., the base station 102a. The terminals 104a and 104b include transceivers 120 and 130 capable of communicating wireless signals through antennas with the base station 102 and processors 122 and 132 controlling communication by the transceivers 120 and 130. The transceiver 112, 120, or 130 may include a radio frequency (RF) processor and communication circuits, such as a modem, and the modem may include transmit components, such as a an encoder, a modulator, and a multiplexer, and receive components, such as a demultiplexer, a demodulator, and a decoder.

If the terminals 104a and 104b are located at a cell edge where they can receive an interference from a neighbor cell, the terminals 104a and 104b may be selected as a user pair for superposition coding. The base station 102 may simultaneously code and transmit messages for the terminals 104a and 104b selected as the user pair by a superposition coding scheme, and the terminals 104a and 104b may restore the desired signal and interference signal distinctively from each other.

The embodiments set forth below are ones for operating, in a cellular environment, a sliding window superposition coding (SWSC) scheme for reaching the theoretical performance limit at the physical layer when there are cell edge terminals whose performance is deteriorated due to interference by neighbor cell(s) in the cellular environment. A system to which the SWSC scheme applies may include one or more senders and one or more receivers and provides a better performance for two or more senders and two or more receivers. Each sender sends messages intended to be transmitted in a superposition coding scheme during a predetermined transmission period (consisting of b blocks), and at this time, one same message is transmitted, superposed during a predetermined number of consecutive blocks. Each receiver may perform a decoding procedure on the signals received, superposed over a predetermined number of consecutive blocks, restoring a desired message.

FIG. 2 is a transmission and reception diagram for describing an SWSC operation according to an embodiment of the present invention. Although an example is shown herein where two senders and two receivers participate in the SWSC operation, one or more senders and/or one or more receivers may attend the SWSC operation depending on coordination by the network. Also, the example described is where the same message is transmitted over two blocks, and the window size is defined as 2.

Referring to FIG. 2, signals transmitted from two senders S1 210 and S2 215 are denoted $X_1$ and $X_2$, and signals received by two receivers R1 220 and R2 225 are denoted $Y_1$ and $Y_2$. At each block 205, sender 1 S1 codes a message for transmission in a superposition coding scheme by two codes U and V, generating a signal $X_1$. Sender 2 S2 generates a signal $X_2$ containing a message for transmission. As an example, each message for transmission may be at least one packet or protocol data unit (PDU).

Specifically, at the first block (block 1), sender 1 codes a message known to sender 1 and all the receivers (denoted "1" for convenience) with a code U to thereby generate a codeword U(1) and codes a message $m_{11}$ for transmission on the first block with a code V to thereby generate a codeword V(1), and then outputs a codeword $X_1(1)$, which is generated by superposition-coding the U(1) and the V(1), from the encoder to a next end (e.g., the modulator or multiplexer), thereby allowing a signal containing codeword $X_1(1)$ to be transmitted to the receivers during the first block. At the first block, sender 2 outputs codeword $X_2(1)$ containing a message $m_{21}$ for transmission from the encoder to a next end, allowing a signal containing the message $m_{21}$ to be transmitted to the receivers.

At the second block (block 2), sender 1 codes the message $m_{11}$ previously transmitted with code U to generate a codeword U(2), codes the message $m_{22}$ for transmission at the second block with code V to generate a codeword V(2), and transmits a codeword $X_1(2)$ generated by superposition-coding the U(2) and the V(2). At the second block, sender 2 transmits a codeword $X_2(2)$ containing the message $m_{22}$ for transmission to the receivers.

Messages are transmitted during (b−1) blocks in such manner. At the last block (block b), sender 1 codes the message $m_{1,b-1}$ previously transmitted with code U to generate a codeword U(b), codes a known message, "1," with code V to generate a codeword V(b), and transmits a codeword $X_1(b)$ generated by superposition-coding the U(b) and the V(b). At the last block, sender 2 transmits a codeword $X_2(b)$ containing the message $m_{2b}$ for transmission.

Although an example has been described above where two codes, U and V, are superposed, and the signal transmitted from sender 1 is generated by $X_1=f(U,V)$, the superposition coding of the signal $X_1$ transmitted from sender 1 may be used in another embodiment.

Each receiver may perform sliding window decoding utilizing signals received superposed over two blocks. That is, receiver 1 detects interference with receiver 1, i.e., $X_2(1)$, by canceling codeword U(1) using the known message "1" and treating the V(1) as noise based on the receive signals $Y_1(1)$ and $Y_1(2)$ of the first block and second block. Next, receiver 1 cancels the U(1) using the known message "1" from the receive signals, cancels the detected signal $X_2(1)$, and treating the V(2) and $X_2(2)$ as noise, detecting the desired signal [V(1) U(2)]. The message $m_{11}$ may be restored from the detected signal. Likewise, if the receive signal $Y_1(3)$ of the third block arrives, receiver 1 may restore the desired message $m_{12}$ by repeating similar operations using the codeword U(2) previously detected, instead of the know message "1." In other words, since the U(2) has already been detected at the second block, the U(2) is operated as the known message at the third block. Likewise, receive 1 may detect desired messages at subsequent blocks. If the receive signal $Y_1(b)$ arrives at the last block, receiver 1 cancels the U(b−1) using the codeword U(b−1) previously detected and cancels the V(b) using the known message "1," detecting the desired signal [V(b−1) U(b)] and restoring the $m_{1,b-1}$.

Receiver 2 detects the desired signal of receiver 1 as interference in a similar manner to that for receiver 1 and detects the desired signal of receiver 2 by canceling the detected interference signal from the receive signals.

Specifically, if the superposed receive signals $Y_2(1)$ and $Y_2(2)$ are entered over the first and second block, receiver 2 cancels the codeword U(1) using the known message "1" and treating the $X_2(1)$ and V(2) and $X_2(2)$ as noise, thereby detecting [V(1) U(2)] which is interference with receiver 2 and restoring the $m_{11}$. (the restored $m_{11}$ is denoted hat_$m_{11}$) In a next step, receiver 2 cancels the V(1) detected at the previous block using the message $m_{11}$ using the message "1" known from the receive signals and then detects the $X_2(1)$ to restore the $m_{21}$. Likewise, receive 2 may detect desired messages at subsequent blocks. If the receive signal $Y_1(b)$ arrives at the last block, receiver 2 performs decoding on the receive signals of the latest two blocks using the codeword V(b) previously detected.

In order to operate an SWSC scheme in a cellular environment, one of the senders 102 and 102a or a separate network entity (not shown) may be operated as a coordinator. The coordinator may perform inter-base station co-scheduling, select a user pair to which superposition coding is to apply considering the capacity region, provide signaling information about the SWSC scheme applied to packets transmitted, and control the feedback and retransmission for SWSC transmission.

Figure 3:
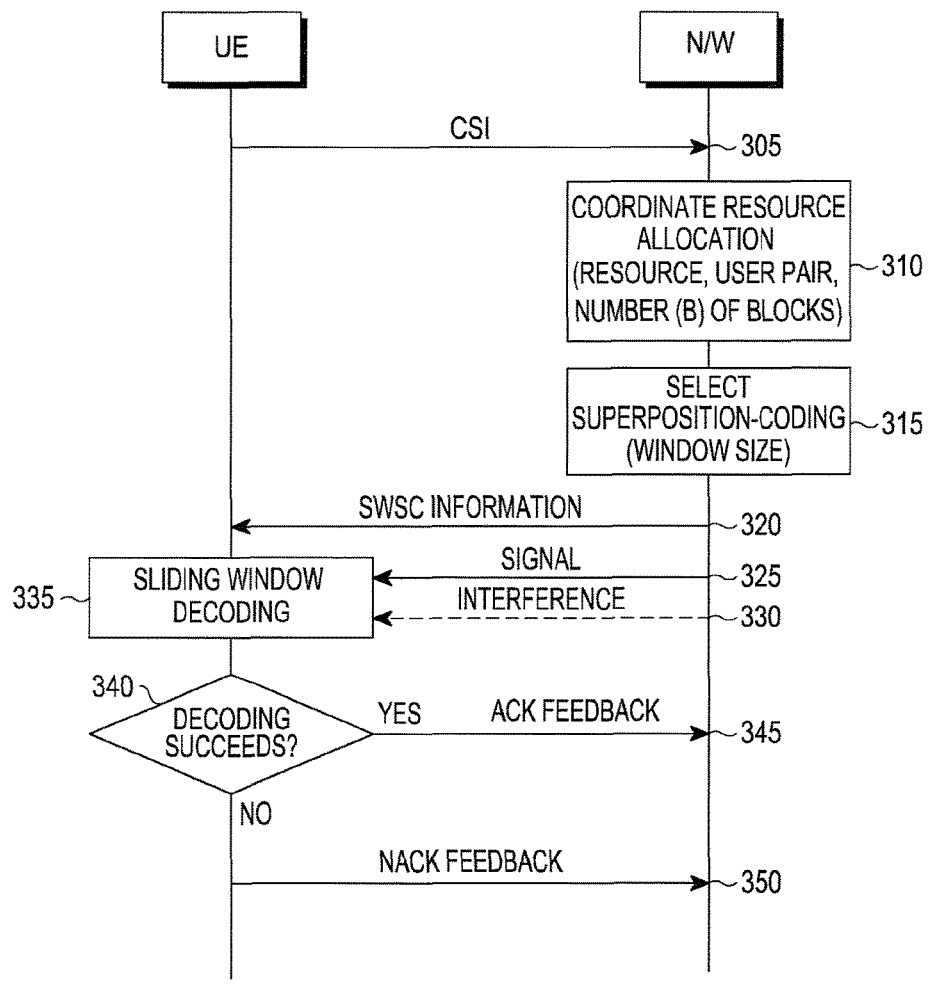
FIG. 3 is a flowchart illustrating a transmission procedure between a terminal and a network according to an embodiment of the present invention.

FIG. 3 is a flowchart illustrating a transmission procedure between a terminal and a network according to an embodiment of the present invention. Here, the network includes one or more base stations.

Referring to FIG. 3, in step 305, the terminal periodically or aperiodically reports CSI to the network as per a predetermined channel status information (CSI) feedback scheme. The CSI may include all of the channel quality for a channel carrying a desired signal (i.e., a desired channel) and the channel quality for a channel carrying an interference signal (i.e., an interference channel) and may be reported through a backhaul network to the coordinator or base station operated as the coordinator.

In step 310, one base station (or coordinator) in the network coordinates resource allocation by referring to CSI gathered directly from the terminal or other terminal(s) (not shown) or through neighbor base station(s). By the coordination, at least one of whether the SWSC applies, time and/or frequency resource, user pair, and the pair and transmission period (i.e., the total number b of blocks for transmission), and modulation and coding scheme (MCS) level achievable by the SWSC may be determined. In step 315, when the SWSC is determined to apply, the base station may additionally determine at least one of parameters for the SWSC operation, e.g., U, V, and window size.

In step 320, the base station transmits control information containing SWSC-related information (hereinafter, denoted "SWSC information") to a terminal determined to participate in the SWSC operation. The SWSC information may include at least one of an indication for whether the SWSC applies, an indication indicating the start of the SWSC, time/frequency resource, SWSC parameters, the number of paired users, window size, information (b) about transmission period, and MCS level. The SWSC information, after delivered through a backhaul to a neighbor base station attending the SWSC operation, may also be transferred to the terminal by the neighbor base station.

In steps 325 and 330, the base station in the network and the neighbor base station code a desired signal for the terminal and a signal (i.e., interference signal) for another terminal as per the SWSC scheme and transmit through the allocated resource. The terminal receives signals superposed as the desired signal and the interference signal are damaged by noise. In step 335, the terminal performs sliding window decoding on the signals received during a predetermined number of blocks, and the terminal, in step 340, determines whether the decoding succeeds, i.e., whether the detected message contains an error. If the decoding succeeds, the terminal, in step 345, transmits an acknowledgement (ACK) through a feedback channel to the network (or a corresponding base station). The feedback may be carried out in the window size, b, or each period of another predetermined number of blocks. The base station and neighbor base station receiving the ACK may transmit a new message through the resource.

In contrast, if the decoding fails, the terminal, in step 350, sends a non-acknowledgement (NACK) through the feedback channel, notifying the network of the decoding failure. The base station receiving the NACK codes again the NACKed message, i.e., at least one message for which the terminal failed to decode as per the SWSC scheme and sends through the allocated resource. Thereafter, new messages will start to be transmitted through superposition coding.

Figure 4:
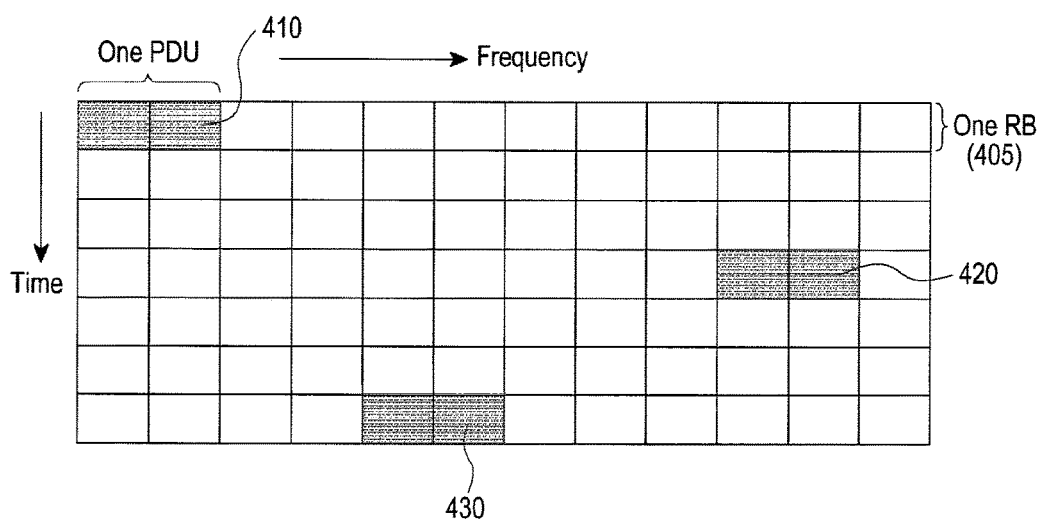
FIG. 4 illustrates an example of allocation of a resource jointly scheduled between base stations according to an embodiment of the present invention.

FIG. 4 illustrates an example of allocation of a resource jointly scheduled between base stations according to an embodiment of the present invention.

Referring to FIG. 4, the horizontal axis means the frequency band consisting of a plurality of subcarriers, and the vertical axis means the time interval (e.g., slot) consisting of a plurality of symbols. The unit of allocation of a time-frequency resource may be a resource block (RB) 420 constituted of a predetermined number of symbols and subcarriers. In the example shown, a resource for HARQ transmission of one PDU 410 may be allocated, jumped as much as an average feedback delay for an HARQ operation, e.g., a two-symbol interval, in the time domain (410, 420, and 430).

If the PDU 410 first transmitted is an NACK, the second PDU 420 containing the same message is transmitted after a two-symbol interval. If the second PDU 420 is NACKed again, the third PDU 430 containing the same message may be transmitted, likewise, after a two-symbol interval.

Figure 5:
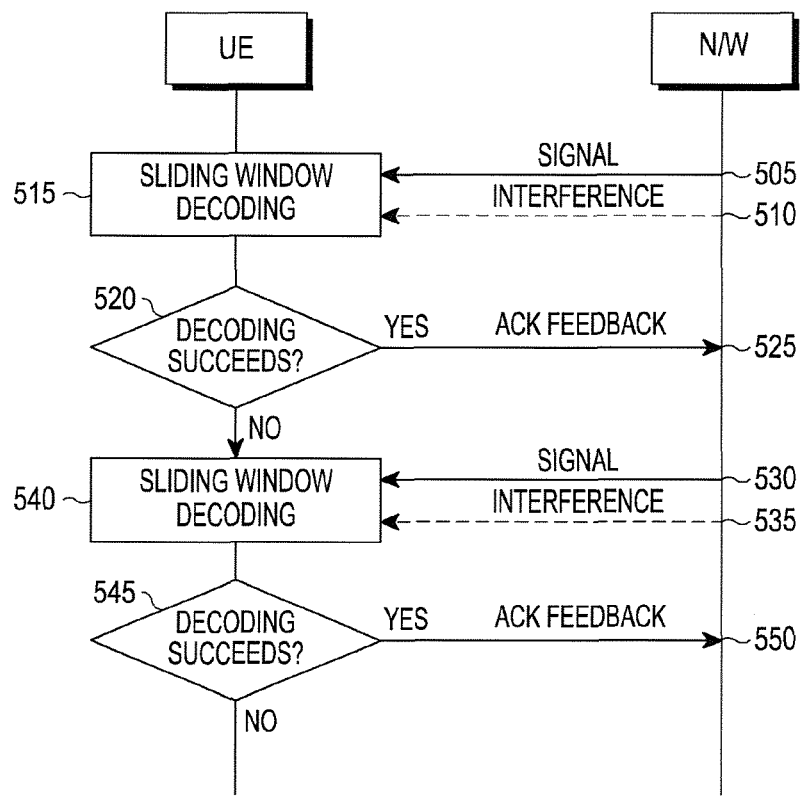
FIG. 5 is a flowchart illustrating a feedback procedure of an ACK according to an embodiment of the present invention.

FIG. 5 is a flowchart illustrating a feedback procedure of an ACK according to an embodiment of the present invention.

Referring to FIG. 5, in steps 505 and 510, the base station in the network and at least one neighbor base station superposition code a signal for a terminal and a signal for another terminal (i.e., an interference signal) as per the SWSC scheme and transmit. In step 515, the terminal performs sliding window decoding on the superposed receive signals of the desired signal and the interference signal, and in step 525, determines whether the decoding succeeds. If the decoding succeeds, the terminal, in step 525, transmits an ACK through a feedback channel to the network. In steps 530 and 535, the base station in the network and at least one neighbor base station superposition code a signal for the terminal and an interference signal containing a new message and transmit. In step 540, the terminal performs sliding window decoding on the receive signal and determines whether the decoding succeeds in step 545. If the decoding succeeds, the terminal, in step 550, transmits an ACK through a feedback channel to the network and repeats similar operations thereafter.

Hereinafter, embodiments for operations when a NACK is fed back from a terminal are described.

Figure 6:
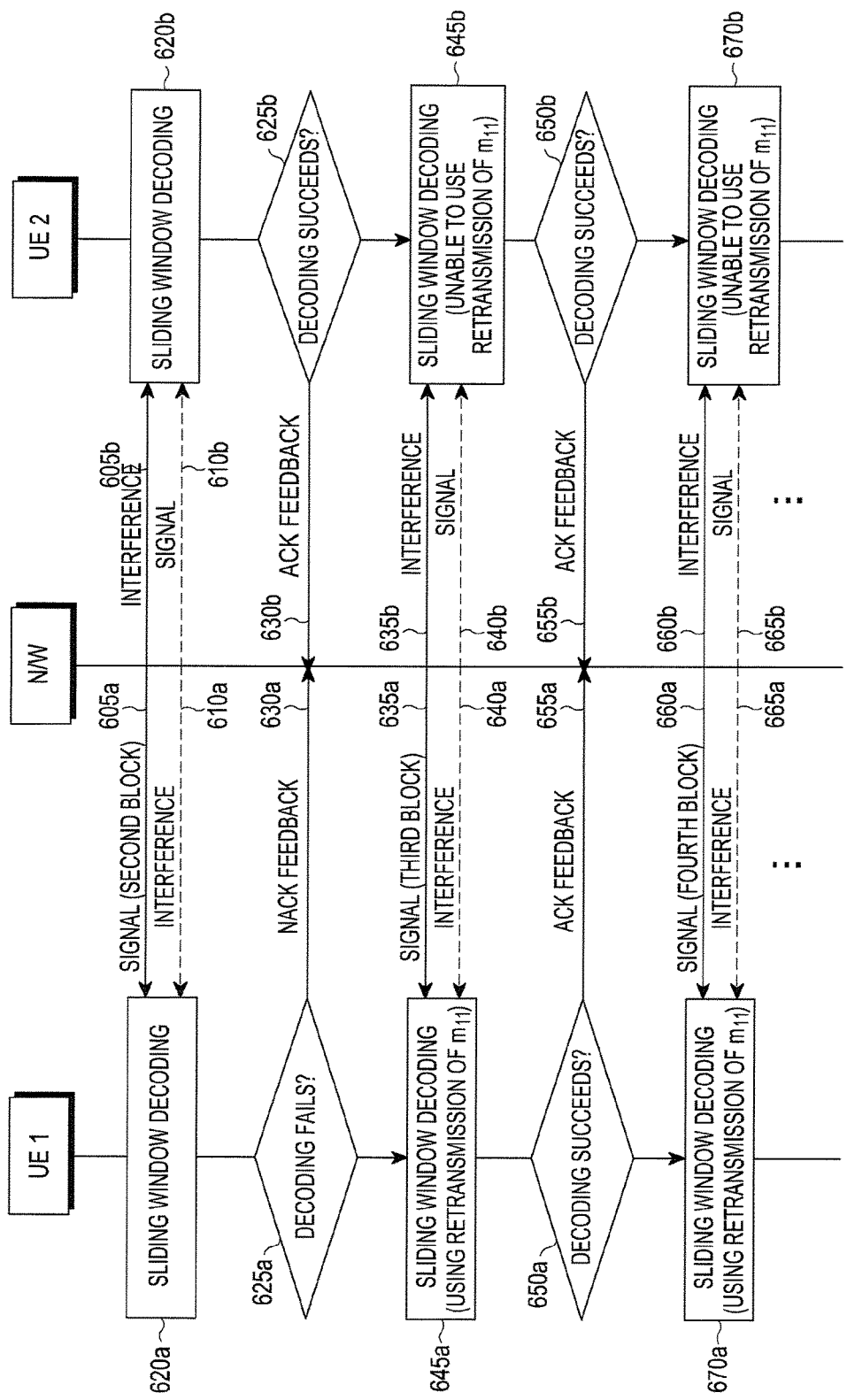
FIG. 6 is a flowchart illustrating a retransmission procedure of a message in a case where there is no inter-base station coordination according to an embodiment of the present invention.

FIG. 6 is a flowchart illustrating a retransmission procedure of a message in a case where there is no inter-base station adjustment according to an embodiment of the present invention. FIG. 7 is a transmission diagram according to the flow of FIG. 6.

Referring to FIG. 6, in steps 605a and 605b, base station 1 which is a serving base station of terminal 1 among base stations in the network transmits a signal obtained by superposition coding a message $m_{11}$ and a message $m_{12}$ for terminal 1 during a second block. In steps 610a and 610b, base station 2 which is a serving base station of terminal 2 transmits a signal containing a message $m_{22}$ for terminal 2 during the second block. In steps 620a and 620b, terminal 1 and terminal 2 each perform sliding window decoding on their respective receive signals.

In step 625a, terminal 1 determines a failure of decoding for the desired message $m_{11}$, and in step 630a, feeds a NACK back to the network. In step 625b, terminal 2 determines success in decoding for the desired message $m_{22}$, and in step 630b, feeds an ACK back to the network. Here, the NACK of terminal 1 is delivered to base station 1 which is the serving base station of terminal 1, and the ACK of terminal 2 is delivered to base station 2 which is the serving base station of terminal 2. Because of lack of inter-base station coordination, each base station cannot be aware of the feedback delivered to the other base station.

In steps 635a and 635b, base station 1 transmits a signal obtained by superposition coding the previously transmitted message $m_{12}$ for terminal 1 and the NACKed message $m_{11}$ 700 during a third block, and in steps 640a and 640b, base station 2 transmits a signal containing a new message $m_{23}$ for terminal 2 during the third block. In steps 645a and 645b, terminal 1 and terminal 2 each perform sliding window decoding on their respective receive signals. At this time, since terminal 1 is aware that the superposition-coded signal includes the NACKed message $m_{11}$, terminal 1 may perform decoding on the third block additionally using the superposition-coded signal containing the message $m_{11}$ received at the previous block in step 645a. In contrast, since terminal 2 is unaware that the NACKed message $m_{11}$ is re-transmitted, terminal 2 performs decoding in the same manner as an existing one while deeming a new message as carried on the receive signal as does it in an existing manner in step 645b.

In step 650a, terminal 1 detects all of the desired message $m_{12}$ and the message $m_{11}$ previously NACKed to determine whether the decoding succeeds and feeds an ACK back to the network in step 655a. In step 650b, terminal 2 determines success in decoding for the desired message m23, and in step 655b, feeds an ACK back to the network.

In steps 660a and 660b, base station 1 transmits a superposition-code signal containing the previously transmitted message $m_{11}$ 705 for terminal 1 and a new message $m_{13}$ 710 during a fourth block, and in steps 665b and 665b, base station 2 transmits a signal containing a new message $m_{24}$ for terminal 2 during the fourth block. In steps 670a and 670b, terminal 1 and terminal 2 each perform sliding window decoding on their respective receive signals. Then, similar operations are repeated until the last block (i.e., block b) arrives.

In the above-described embodiments, the base station applying the SWSC, upon reception of a NACK from the terminal, superposition-codes the message transmitted at the previous block and the message NACKed at the previous block and transmits the superposition-coded signal, and it uses the NACKed message in performing sliding window decoding on the receive signals of the current block.

Figure 8:
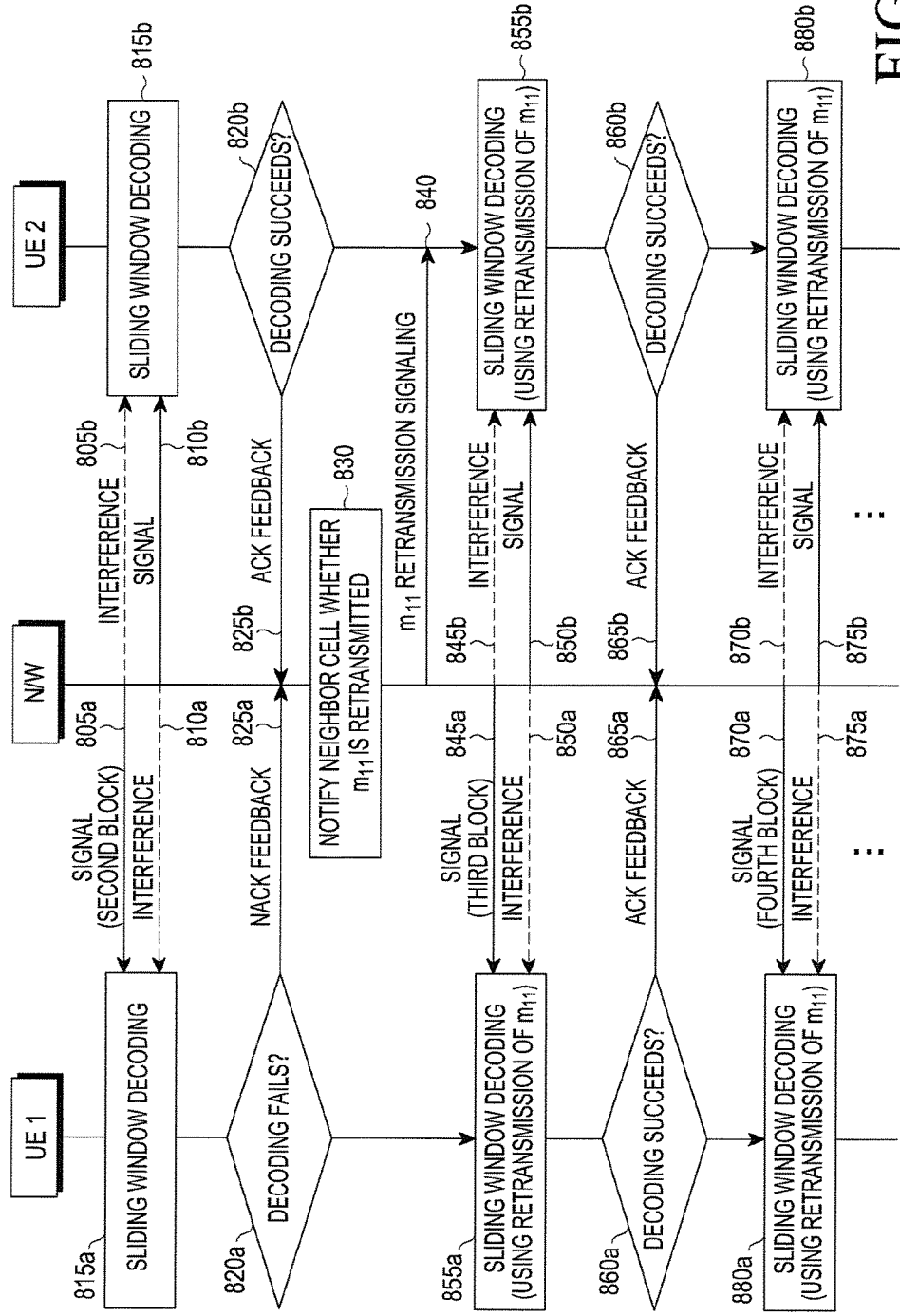
FIG. 8 is a flowchart illustrating a retransmission procedure of a message in a case where there is an inter-base station coordination according to an embodiment of the present invention.

FIG. 8 is a flowchart illustrating a retransmission procedure of a message in a case where there is an inter-base station coordination according to an embodiment of the present invention. The transmission diagram according to the flow of FIG. 8 is the same as that shown in FIG. 7.

Referring to FIG. 8, in steps 805a and 805b, base station 1 which is a serving base station of terminal 1 among base stations in the network transmits a signal obtained by superposition coding a message $m_{11}$ and a message $m_{12}$ for terminal 1 during a second block. In steps 810a and 810b, base station 2 which is a serving base station of terminal 2 transmits a signal containing a message $m_{22}$ for terminal 2 during the second block. In steps 815a and 815b, terminal 1 and terminal 2 each perform sliding window decoding on their respective receive signals.

In step 820a, terminal 1 determines a failure of decoding for the desired message $m_{11}$, and in step 825a, feeds a NACK back to the network. In step 820b, terminal 2 determines success in decoding for the desired message $m_{22}$, and in step 825b, feeds an ACK back to the network. Here, the NACK of terminal 1 is delivered to base station 1 which is the serving base station of terminal 1, and the ACK of terminal 2 is delivered to base station 2 which is the serving base station of terminal 2. In step 830, a coordinator (or base station 1) in charge of inter-base station coordination gathers feedbacks of base station 1 and base station 2 and notifies base station 2, a neighbor cell, of the information about the NACK feedback received by base station 1. Accordingly, in step 840, signaling indicating that the message $m_{11}$ has been NACKed and that it is to be retransmitted later is transmitted from base station 2 to terminal 2. As set forth above, where there is inter-base station coordination, the terminal may obtain information about a feedback delivered from another terminal.

In steps 845a and 845b, base station 1 transmits a signal obtained by superposition coding the previously transmitted message $m_{12}$ for terminal 1 and the NACKed message $m_{11}$ 700 during a third block, and in steps 850a and 850b, base station 2 transmits a signal containing a new message $m_{23}$ for terminal 2 during the third block. In steps 855a and 855b, terminal 1 and terminal 2 each perform sliding window decoding on their respective receive signals. At this time, since terminal 1 is aware that the superposition-coded signal includes the NACKed message $m_{11}$, terminal 1 may perform decoding on the third block additionally using the superposition-coded signal containing the message $m_{11}$ received at the previous block in step 855a. Likewise, in step 855b, terminal 2, because of being aware that the NACKed message $m_{11}$ is to be retransmitted, may perform more efficient decoding using the retransmitted message m11 restored in the previous block.

In step 860a, terminal 1 detects all of the desired message $m_{12}$ and the message $m_{11}$ previously NACKed to determine whether the decoding succeeds and feeds an ACK back to the network in step 865a. In step 860b, terminal 2 determines success in decoding for the desired message $m_{23}$, and in step 865b, feeds an ACK back to the network.

In steps 870a and 870b, base station 1 transmits a superposition-code signal containing the previously transmitted message $m_{11}$ 705 for terminal 1 and a new message $m_{13}$ 710 during a fourth block, and in steps 875a and 875b, base station 2 transmits a signal containing a new message $m_{24}$ for terminal 2 during the fourth block. In steps 880a and 880b, terminal 1 and terminal 2 each perform sliding window decoding on their respective receive signals. Then, similar operations are repeated until the last block (i.e., block b) arrives.

In the above-described embodiments, the base station applying the SWSC, upon reception of a NACK from the terminal, superposition-codes the message transmitted at the previous block and the message NACKed at the previous block and transmits the superposition-coded signal. Further, the terminal may receive information about the NACKed message from another terminal in the previous block from the base station and may use the retransmission of the NACKed message in performing sliding window decoding on the receive signal of the current block.

Figure 9:
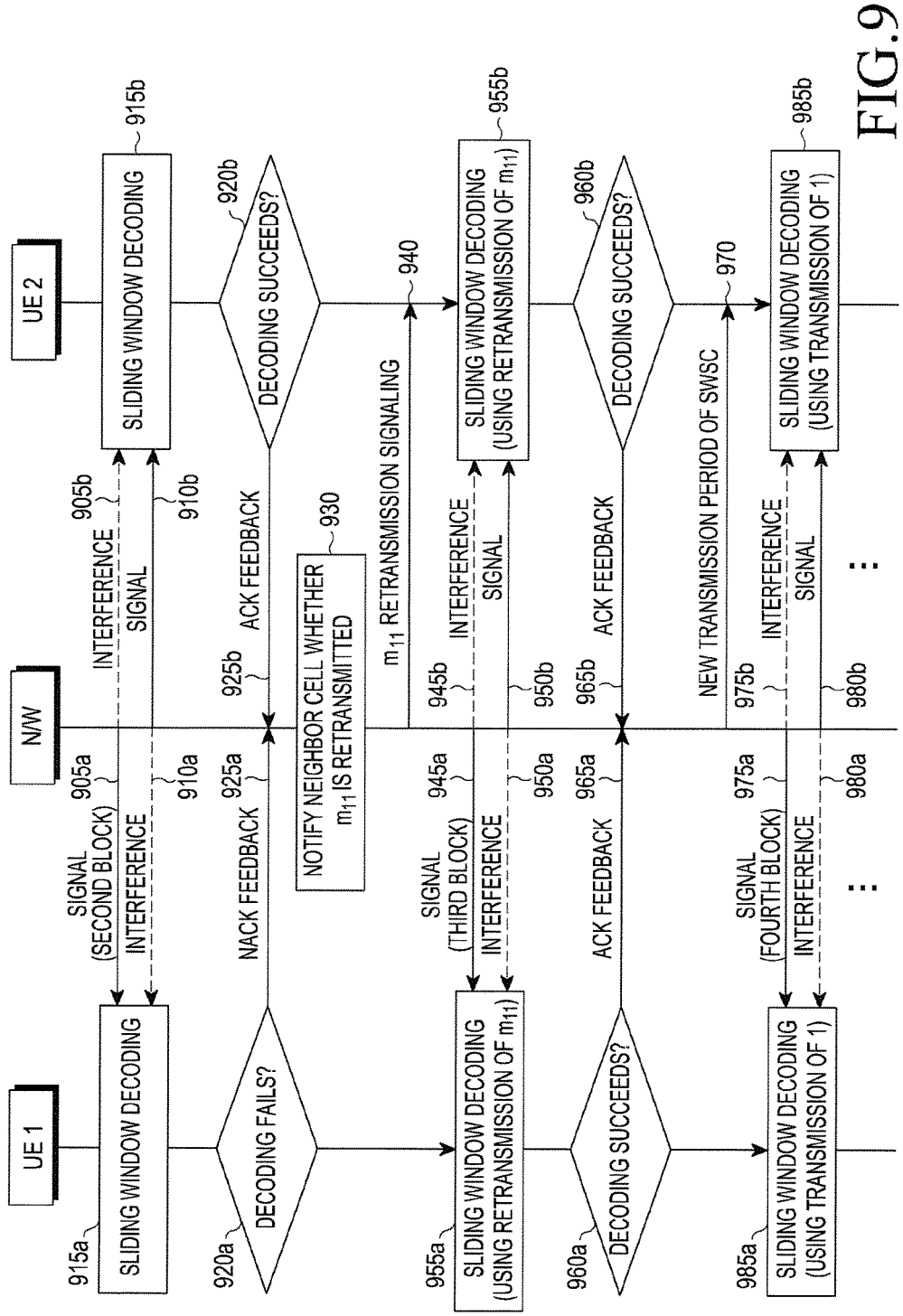
FIG. 9 is a flowchart illustrating a retransmission procedure of a known message in a case where there is an inter-base station coordination according to an embodiment of the present invention.

FIG. 9 is a flowchart illustrating a retransmission procedure of a known message in a case where there is an inter-base station coordination according to an embodiment of the present invention. FIG. 10 is a transmission diagram according to the flow of FIG. 9.

Referring to FIG. 9, in steps 905a and 905b, base station 1 which is a serving base station of terminal 1 among base stations in the network transmits a signal obtained by superposition coding a message $m_{11}$ and a message $m_{12}$ for terminal 1 during a second block. In steps 910a and 910b, base station 2 which is a serving base station of terminal 2 transmits a signal containing a message $m_{22}$ for terminal 2 during the second block. In steps 915a and 915b, terminal 1 and terminal 2 each perform sliding window decoding on their respective receive signals.

In step 920a, terminal 1 determines a failure of decoding for the desired message $m_{11}$, and in step 925a, feeds a NACK back to the network. In step 920b, terminal 2 determines success in decoding for the desired message $m_{22}$, and in step 925b, feeds an ACK back to the network. Here, the NACK of terminal 1 is delivered to base station 1 which is the serving base station of terminal 1, and the ACK of terminal 2 is delivered to base station 2 which is the serving base station of terminal 2. In step 930, a coordinator (or base station 1) in charge of inter-base station coordination gathers feedbacks of base station 1 and base station 2 and notifies base station 2, a neighbor cell, of the information about the NACK feedback received by base station 1. Accordingly, in step 940, signaling indicating that the message $m_{11}$ has been NACKed and that it is to be retransmitted later is transmitted from base station 2 to terminal 2. As set forth above, where there is inter-base station coordination, the terminal may obtain information about a feedback delivered from another terminal.

In steps 945a and 945b, base station 1 transmits a signal obtained by superposition coding the previously transmitted message $m_{12}$ for terminal 1 and the NACKed message $m_{11}$ 1000 during a third block, and in steps 950a and 950b, base station 2 transmits a signal containing a new message $m_{23}$ for terminal 2 during the third block. In steps 955a and 955b, terminal 1 and terminal 2 each perform sliding window decoding on their respective receive signals. At this time, since terminal 1 is aware that the superposition-coded signal includes the NACKed message $m_{11}$, terminal 1 may perform decoding on the third block additionally using the superposition-coded signal containing the message $m_{11}$ received at the previous block in step 955a. Likewise, in step 955b, terminal 2, because of being aware that the NACKed message $m_{11}$ is to be retransmitted, may perform more efficient decoding using the retransmitted message $m_{11}$ restored in the previous block.

In step 960a, terminal 1 detects all of the desired message $m_{12}$ and the message $m_{11}$ previously NACKed to determine whether the decoding succeeds and feeds an ACK back to the network in step 965a. In step 960b, terminal 2 determines success in decoding for the desired message $m_{23}$, and in step 965b, feeds an ACK back to the network.

In step 970, the coordinator (or base station 1) recognizes that the NACKed message has successfully received by terminal 1 and sends signaling to indicate that a new transmission period of SWSC begins to terminal 2 through base station 2. The signaling may be transmitted only to terminal 2 or both terminal 1 and terminal 2 participating in the SWSC.

In steps 975a and 975b, base station 1 transmits a superposition-coded signal containing the known message "1" 1005 and a new message $m_{13}$ 1010, and in steps 980a and 980b, base station 2 transmits a signal containing a new message $m_{24}$ for terminal 2. The period of transmission of the signal containing the known message "1" may be the fourth block or a new first block. In steps 985a and 985b, terminal 1 and terminal 2 each perform sliding window decoding on their respective receive signals. Terminal 1, because of having sent the ACK in step 965a, may utilize the known message "1" in performing sliding window decoding of step 985a. Terminal 2, because of having received the signaling of step 970, may use the known message "1" upon sliding window decoding at step 985b. Then, similar operations are repeated until the last block (i.e., block b) arrives.

In the above-described embodiments, the base station applying the SWSC, upon reception of a NACK from the terminal, superposition-codes the message transmitted at the previous block and the message NACKed at the previous block and transmits the superposition-coded signal. Further, the terminal may receive information about the NACKed message from another terminal in the previous block from the base station and may use the retransmission of the NACKed message in performing sliding window decoding on the receive signal of the current block. If the ACK for the retransmitted message is confirmed, the base stations newly start the transmission period of SWSC under the control of the coordinator. That is, they perform superposition coding using the known message "1."

Upon determining a decoding failure in the SWSC operation, the terminal may determine information necessary for retransmission and report it to the base station rather than transmitting a NACK. The information may be configured in the form of a soft feedback.

Figure 11:
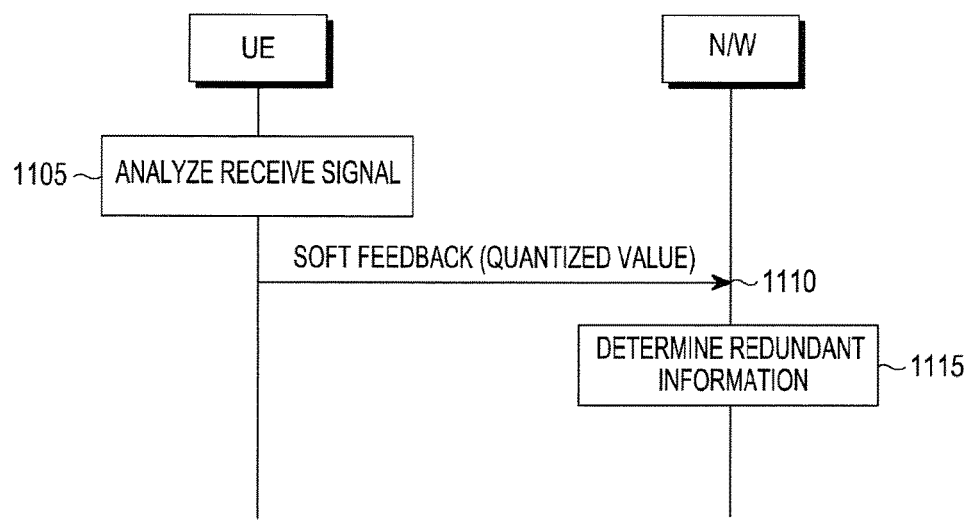
FIG. 11 is a flowchart illustrating a soft feedback including quantized information for a desired signal according to an embodiment of the present invention.

FIG. 11 is a flowchart illustrating a soft feedback including quantized information for a desired signal according to an embodiment of the present invention.

Referring to FIG. 11, in step 1105, the terminal decodes a receive signal from the network, determines whether the decoding fails, and analyzes the receive signal. Specifically, the terminal determines the average mutual information about the message by analyzing the log likelihood ratio (LLR) meaning the reliability value per symbol of the failed message for decoding of the receive signal. The average mutual information means one obtained by quantizing an average amount (e.g., the number of symbols) of information that the signal received at the previous block retains for a message intended to be restored.

In step 1110, the terminal transmits a soft feedback containing the quantized value for the average mutual information as per a result of the analysis to the network. In step 115, the base station in the network determines redundant information as per the soft feedback and then performs retransmission of the message based on the determined redundant information. The redundant information means the amount of information that should additionally be received to restore the failed message for restoration, i.e., the average mutual information determined by the terminal, and the base station generates a retransmission message based on the determined redundant information and transmits the retransmission message. As an example, if the amount of information necessary to restore the signal that the terminal has failed to restore is smaller than the symbols of one block, the base station superposition-codes a retransmission message constituted of as many symbols as one block with a codeword carrying another message and transmits the superposition-coded result.

Figure 12:
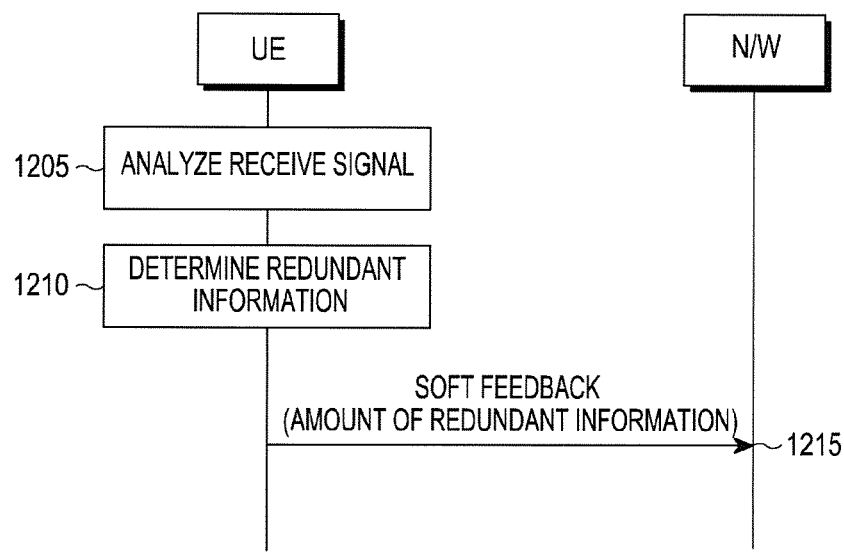
FIG. 12 is a flowchart illustrating a soft feedback including the amount of redundant information for a desired signal according to an embodiment of the present invention.

FIG. 12 is a flowchart illustrating a soft feedback including the amount of redundant information for a desired signal according to an embodiment of the present invention.

Referring to FIG. 12, in step 1205, the terminal decodes a receive signal from the network, determines whether the decoding fails, and analyzes the receive signal Specifically, the terminal determines the average mutual information about the message by analyzing the LLR meaning the reliability value per symbol of the failed message for decoding of the receive signal.

In step 1210, the terminal determines redundant information necessary for the base station to perform retransmission as per the average mutual information, and in step 1115, the terminal transmits a soft feedback containing the amount of redundant information to the network. Thereafter, the base station in the network retransmits the message based on the redundant information indicated by the soft feedback.

Figure 13:
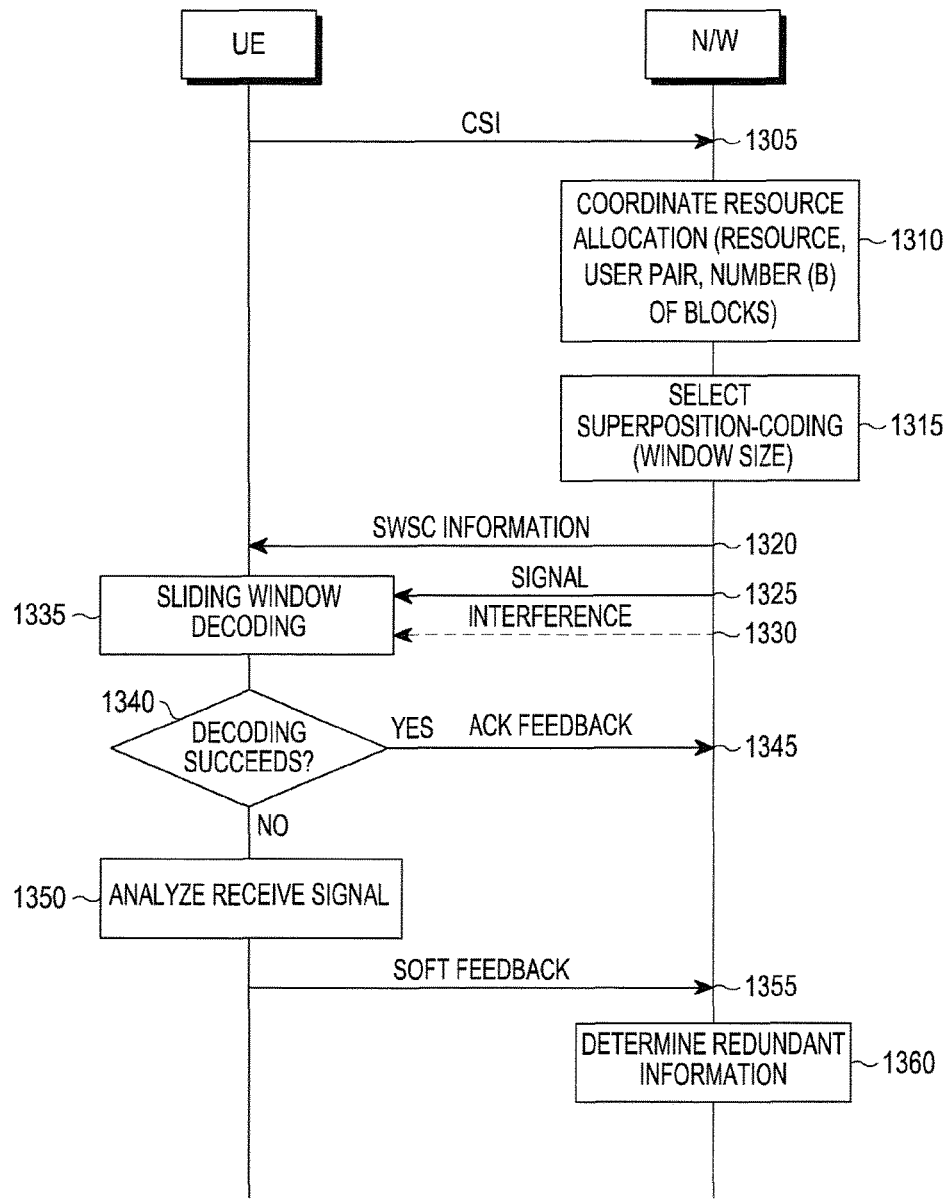
FIG. 13 is a flowchart illustrating a transmission procedure between a terminal and a network including a soft feedback according to an embodiment of the present invention.

FIG. 13 is a flowchart illustrating a transmission procedure between a terminal and a network including a soft feedback according to an embodiment of the present invention. Here, the network includes one or more base stations.

Referring to FIG. 13, in step 1305, the terminal periodically or aperiodically reports CSI to the network as per a predetermined feedback scheme. The CSI may include all of the channel quality for a channel carrying a desired signal (i.e., a desired channel) and the channel quality for a channel carrying an interference signal (i.e., an interference channel) and may be reported through a backhaul network to the coordinator or base station operated as the coordinator.

In step 1310, one base station (or coordinator) in the network coordinates resource allocation by referring to CSI gathered directly from the terminal or other terminal(s) (not shown) or through neighbor base station(s). By the coordination, at least one of whether the SWSC applies, time and/or frequency resource, user pair, and the pair and transmission period (i.e., the total number b of blocks for transmission), and modulation and coding scheme (MCS) level achievable by the SWSC may be determined. In step 1315, when the SWSC is determined to apply, the base station may additionally determine at least one of parameters for the SWSC operation, e.g., U, V, and window size.

In step 1320, the base station transmits the SWSC information to a terminal determined to participate in the SWSC operation. The SWSC information may include at least one of an indication for whether the SWSC applies, an indication indicating the start of the SWSC, time/frequency resource, SWSC parameters, the number of paired users, window size, transmission period (b), and MCS level. The SWSC information, after delivered through a backhaul to a neighbor base station attending the SWSC operation, may also be transferred to the terminal by the neighbor base station.

In steps 1325 and 1330, the base station in the network and the neighbor base station code a desired signal for the terminal and a signal (i.e., interference signal) for another terminal as per the SWSC scheme and transmit through the allocated resource. The terminal receives signals superposed as the desired signal and the interference signal are damaged by noise. In step 1335, the terminal performs sliding window decoding on the signals received during a predetermined number of blocks, and the terminal, in step 1340, determines whether the decoding succeeds, i.e., whether the detected message contains an error. If the decoding succeeds, the terminal, in step 1345, transmits an ACK through a feedback channel to the network. The feedback may be carried out in the window size, b, or each period of another predetermined number of blocks. The base station and neighbor base station receiving the ACK may transmit a new message through the resource.

If the decoding otherwise fails, the terminal, in step 1350, analyzes the existing receive signal to determine information necessary for retransmission, and in step 1355, reports a soft feedback containing the determined information to the network. In step 1360, if the soft feedback includes a quantized value for the average mutual information, the base station determines redundant information as per the soft feedback and retransmits the message as per the determined redundant information.

Figures 14, 15:
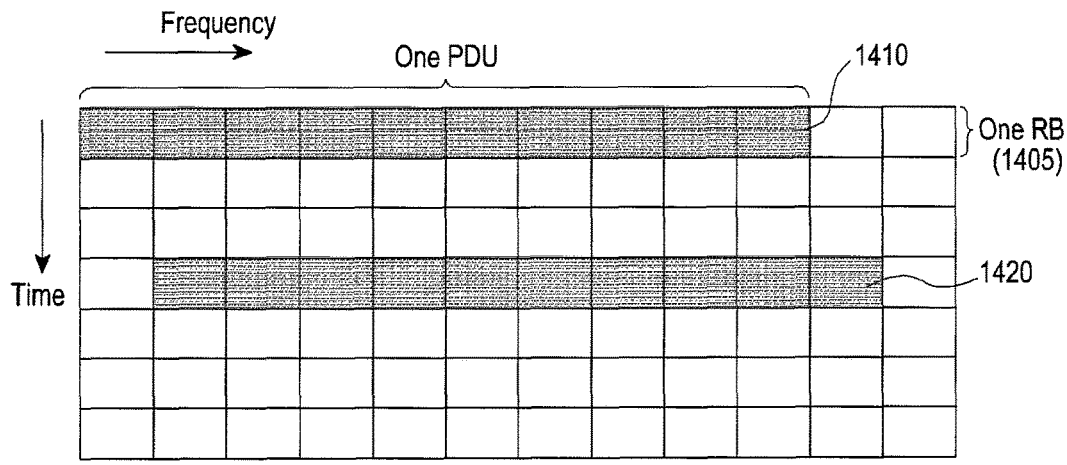
FIG. 14 illustrates another example of allocation of a resource jointly scheduled between base stations according to an embodiment of the present invention.
FIG. 15 is a transmission and reception diagram including retransmission by a second receiver according to an embodiment of the present invention.

FIG. 14 illustrates another example of allocation of a resource jointly scheduled between base stations according to an embodiment of the present invention.

Referring to FIG. 14, the horizontal axis means the frequency band consisting of a plurality of subcarriers, and the vertical axis means the time interval (e.g., slot) consisting of a plurality of symbols. The unit of allocation of a time-frequency resource may be a resource block (RB) 420 constituted of a predetermined number of symbols and subcarriers. In the example shown, a resource for HARQ transmission of one PDU 410 may be allocated for consecutive subcarriers in the frequency domain (1410 and 1420). Thus, the whole SWSC operation may be complete during one time unit (e.g., a subframe).

FIG. 15 is a transmission diagram including retransmission by a second receiver according to an embodiment of the present invention.

Referring to FIG. 15, at the second block, sender 1 transmits a signal obtained by superposition coding messages, $m_{11}$ and $m_{12}$, for receiver 1, and sender 2 transmits a signal containing a message $m_{22}$ for receiver 2. Operations are described where in receiver 1, the decoding of the message $m_{21}$ succeeds, but the decoding of the message $m_{11}$ fails, and in receiver 2, the decoding of the message $m_{11}$ succeeds, and the decoding of the message $m_{21}$ fails.

At the third block, sender 1 transmits a signal obtained by superposition coding the previously transmitted message $m_{12}$ and the NACKed message $m_{11}$ 1500, and sender 2 retransmits the NACKed message $m_{21}$. If the retransmitted message $m_{11}$ is ACKed, sender 1, at the fourth block, transmits a superposition-coded signal of the known message "1" 1505 and a new message $m_{13}$ 1510. If the retransmitted message $m_{21}$ is ACKed, sender 2, at the fourth block, transmits a new message $m_{23}$.

Particular embodiments of the present invention may be implemented as computer readable codes in a computer readable recording medium. The computer readable recording medium is a data storage device that may store data readable by a computer system. Examples of the computer readable recording medium may include read only memories (ROMs), random access memories (RAMs), compact disk-read only memories (CD-ROMs), magnetic tapes, floppy disks, optical data storage devices, and carrier waves (such as data transmission over the Internet). The computer readable recording medium may be distributed by computer systems over a network, and accordingly, the computer readable codes may be stored and executed in a distributed manner. Functional programs, codes, and code segments to attain various embodiments of the present invention may be readily interpreted by skilled programmers in the art to which the present invention pertains.

The apparatuses and methods according to embodiments of the present invention may be implemented in hardware, software, or a combination of hardware and software. Such software may be recorded in volatile or non-volatile storage devices, such as ROMs, memories, such as RAMs, memory chips, memory devices, or integrated circuit devices, compact disks (CDs), DVDs, magnetic disks, magnetic tapes, or other optical or magnetic storage devices while retained in machine (e.g., computer)-readable storage media. The methods according to embodiments of the present invention may be implemented by a computer or a portable terminal including a controller and a memory, and the memory may be an exemplary machine-readable storage medium that may properly retain program(s) containing instructions for implementing the embodiments of the present invention.

Accordingly, the present invention encompasses a program containing codes for implementing the device or method set forth in the claims of this invention and a machine (e.g., computer)-readable storage medium storing the program. The program may be electronically transferred via any media such as communication signals transmitted through a wired or wireless connection and the present invention properly includes the equivalents thereof.

The apparatuses according to embodiments of the present invention may receive the program from a program providing device wiredly or wirelessly connected thereto and store the same. The program providing apparatus may include a memory for storing a program including instructions enabling a program processing apparatus to perform a method according to an embodiment of the present invention and data necessary for a method according to an embodiment of the present invention, a communication unit for performing wired or wireless communication with a graphic processing apparatus, and a controller transmitting the program to the graphic processing apparatus automatically or as requested by the graphic processing apparatus.

The embodiments herein are provided merely for better understanding of the present invention, and the present invention should not be limited thereto or thereby. The embodiments set forth herein are merely examples, and it will be apparent to one of ordinary skill in the art that various changes may be made thereto without departing from the scope of the present invention. The scope of the present invention should be defined by the following claims.

The invention claimed is:

1. A method for transmitting a signal in a wireless communication system, the method comprising the steps of:
   determining a window size and a number of blocks constituting a transmission period for a sliding window superposition coding (SWSC);
   transmitting control information including the determined window size and the number of blocks to a plurality of terminals participating in the SWSC;
   transmitting a signal obtained by superposition-coding a first message and a second message using a first code and a second code at a first block in the transmission period; and
   upon receiving a message indicating that decoding the first message fails, transmitting the signal obtained by superposition-coding the first message and the second message using the first code and the second code at a second block.

2. The method of claim 1, wherein the control information further includes at least one of an indication as to whether the SWSC applies, an indication indicating a start of the SWSC, a time/frequency resource, the first and second code, the number of the terminals participating in the SWSC, or a modulation and coding scheme (MCS) level.

3. The method of claim 1, further comprising the step of, upon receiving a message indicating that decoding the first and second message succeeds, transmitting a signal obtained by superposition-coding the first message and a third message using the first code and the second code at a third block.

4. The method of claim 1, further comprising the steps of:
   upon receiving a message indicating that decoding the first and second message succeeds, transmitting signaling indicating that a new transmission period starts to at least one of the terminals participating in the SWSC; and
   transmitting a signal obtained by superposition-coding a predetermined, known message and a third message using the first code and the second code at a third block.

5. The method of claim 1, wherein the message indicating that the decoding fails includes a quantized value for an amount of additional information necessary for succeeding in retransmission of the first message.

6. The method of claim 1, wherein the message indicating that the decoding fails includes an amount of redundant information necessary to perform retransmission of the first message.

7. A method for receiving a signal in a wireless communication system, the method comprising the steps of:
   receiving, from a base station, control information including a window size and a number of blocks constituting a transmission period for a sliding window superposition coding (SWSC);
   receiving a signal obtained by superposition-coding a first message and a second message using a first code and a second code at a first block in the transmission period;
   transmitting a message indicating that decoding the first message fails; and
   receiving the signal obtained by superposition-coding the first message and the second message using the first code and the second code at a second block.

8. The method of claim 7, wherein the control information further includes at least one of an indication as to whether the SWSC applies, an indication indicating a start of the SWSC, a time/frequency resource, the first and second code, a number of terminals participating in the SWSC, or a modulation and coding scheme (MCS) level.

9. The method of claim 7, further comprising the steps of:
   transmitting a message indicating that decoding the first and second message succeeds; and
   receiving a signal obtained by superposition-coding the first message and a third message using the first code and the second code at a third block.

10. The method of claim 7, further comprising the steps of:
    transmitting a message indicating that decoding the first and second message succeeds;
    receiving, from the base station, signaling indicating that a new transmission period starts; and
    receiving a signal obtained by superposition-coding a predetermined, known message and a third message using the first code and the second code at a third block.

11. The method of claim 7, wherein the message indicating that the decoding fails includes a quantized value for an amount of additional information necessary for succeeding in retransmission of the first message.

12. The method of claim 7, wherein the message indicating that the decoding fails includes an amount of redundant information necessary to perform retransmission of the first message.

13. An apparatus for transmitting a signal in a wireless communication system, the apparatus comprising:
    a processor configured to determine a window size and a number of blocks constituting a transmission period for a sliding window superposition coding (SWSC); and
    a transceiver configured to:
       transmit control information including the determined window size and the number of blocks to a plurality of terminals participating in the SWSC;
       transmit a signal obtained by superposition-coding a first message and a second message using a first code and a second code at a first block in the transmission period; and
       upon receiving a message indicating that decoding the first message fails, transmit the signal obtained by superposition-coding the first message and the second message using the first code and the second code at a second block.

14. The apparatus of claim 13, wherein the control information further includes at least one of an indication as to whether the SWSC applies, an indication indicating a start of the SWSC, a time/frequency resource, the first and second code, the number of the terminals participating in the SWSC, or a modulation and coding scheme (MCS) level.

15. The apparatus of claim 13, wherein the transceiver is further configured to, upon receiving a message indicating that decoding the first and second message succeeds, transmit a signal obtained by superposition-coding the first message and a third message using the first code and the second code at a third block.

16. The apparatus of claim 13, wherein the transceiver is further configured to:
    upon receiving a message indicating that decoding the first and second message succeeds, transmit signaling indicating that a new transmission period starts to at least one of the terminals participating in the SWSC; and
    transmit a signal obtained by superposition-coding a predetermined, known message and a third message using the first code and the second code at a third block.

17. The apparatus of claim 13, wherein the message indicating that the decoding fails includes a quantized value for an amount of additional information necessary for succeeding in retransmission of the first message.

18. The apparatus of claim 13, wherein the message indicating that the decoding fails includes an amount of redundant information necessary to perform retransmission of the first message.

19. An apparatus for receiving a signal in a wireless communication system, the apparatus comprising:
- a transceiver configured to:
  - receive, from a base station, control information including a window size and a number of blocks constituting a transmission period for a sliding window superposition coding (SWSC);
  - receive a signal obtained by superposition-coding a first message and a second message using a first code and a second code at a first block in the transmission period;
  - transmit a message indicating that decoding the first message fails; and
  - receive the signal obtained by superposition-coding the first message and the second message using the first code and the second code at a second block; and
- a processor configured to control the transceiver based on the control information.

20. The apparatus of claim 19, wherein the control information further includes at least one of an indication as to whether the SWSC applies, an indication indicating a start of the SWSC, a time/frequency resource, the first and second code, a number of terminals participating in the SWSC, or a modulation and coding scheme (MCS) level.

21. The apparatus of claim 19, wherein the transceiver is further configured to:
- transmit a message indicating that decoding the first and second message succeeds; and
- receive a signal obtained by superposition-coding the first message and a third message using the first code and the second code at a third block.

22. The apparatus of claim 19, wherein the transceiver is further configured to:
- transmit a message indicating that decoding the first and second message succeeds;
- receive, from the base station, signaling indicating that a new transmission period starts; and
- receive a signal obtained by superposition-coding a predetermined, known message and a third message using the first code and the second code at a third block.

23. The apparatus of claim 19, wherein the message indicating that the decoding fails includes a quantized value for an amount of additional information necessary for succeeding in retransmission of the first message.

24. The apparatus of claim 19, wherein the message indicating that the decoding fails includes an amount of redundant information necessary to perform retransmission of the first message.

* * * * *